United States Patent
Chen et al.

(10) Patent No.: US 7,709,397 B2
(45) Date of Patent: May 4, 2010

(54) METHOD AND SYSTEM FOR ETCHING A HIGH-K DIELECTRIC MATERIAL

(75) Inventors: Lee Chen, Cedar Creek, TX (US); Hiromitsu Kambara, Austin, TX (US); Nobuhiro Iwama, Lexington, MA (US); Akiteru Ko, Beverly, MA (US); Hiromasa Mochiki, Kofu (JP); Masaaki Hagihara, Beverly, MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/852,685

(22) Filed: May 25, 2004

(65) Prior Publication Data

US 2005/0164511 A1     Jul. 28, 2005

Related U.S. Application Data

(60) Provisional application No. 60/474,224, filed on May 30, 2003, provisional application No. 60/474,225, filed on May 30, 2003.

(51) Int. Cl.
*H01L 21/302* (2006.01)
(52) U.S. Cl. .................. 438/738; 438/710; 438/722; 438/723; 438/735; 438/737; 257/E21.218; 257/E21.219
(58) Field of Classification Search .......... 438/706, 438/707, 710, 715, 719, 722, 723, 735, 737, 438/738, 743; 257/E21.218, E21.219
See application file for complete search history.

(56) References Cited

U.S. PATENT DOCUMENTS

| | | | |
|---|---|---|---|
| 5,225,036 A | | 7/1993 | Watanabe et al. |
| 5,591,998 A | * | 1/1997 | Kimura et al. .............. 257/306 |
| 5,776,356 A | | 7/1998 | Yokoyama et al. |
| 6,322,714 B1 | | 11/2001 | Nallan et al. |
| 6,451,647 B1 | | 9/2002 | Yang et al. |
| 6,511,918 B2 | | 1/2003 | Wege et al. |
| 6,528,328 B1 | | 3/2003 | Aggarwal et al. |
| 2002/0011461 A1 | | 1/2002 | Wege et al. |

(Continued)

FOREIGN PATENT DOCUMENTS

EP     1 422 751 A2     5/2004

(Continued)

OTHER PUBLICATIONS

Norasetthekul, S et al., "Etch characteristics of HfO2 Films on Si substrates," Applied Surface Science, Elsevier Science B.V., as listed in the PCT Search Report, p. 75-81, ( Feb. 14, 2002).

(Continued)

*Primary Examiner*—Matthew C Landau
*Assistant Examiner*—Colleen E Snow

(57) ABSTRACT

A method for etching a high-k dielectric layer on a substrate in a plasma processing system is described. The high-k dielectric layer can, for example, comprise $HfO_2$. The method comprises elevating the temperature of the substrate above 200° C. (i.e., typically of order 400° C.), introducing a process gas comprising a halogen-containing gas, igniting a plasma from the process gas, and exposing the substrate to the plasma. The process gas can further include a reduction gas in order to improve the etch rate of $HfO_2$ relative to Si and $SiO_2$.

12 Claims, 9 Drawing Sheets

U.S. PATENT DOCUMENTS

| | | | |
|---|---|---|---|
| 2003/0037802 A1 | 2/2003 | Nakahara et al. | |
| 2003/0047532 A1 | 3/2003 | Yamauchi | |
| 2003/0170986 A1 | 9/2003 | Nallan et al. | |
| 2004/0011380 A1* | 1/2004 | Ji et al. | 134/1.1 |
| 2004/0129671 A1* | 7/2004 | Ji et al. | 216/58 |
| 2004/0131524 A1* | 7/2004 | Josephson et al. | 423/240 R |
| 2005/0176191 A1* | 8/2005 | Kumar et al. | 438/197 |

FOREIGN PATENT DOCUMENTS

| | | |
|---|---|---|
| EP | 1 469 510 A2 | 10/2004 |
| JP | H08236503 A | 9/1996 |
| JP | 2001077059 A | 3/2001 |
| JP | 2001517372 A | 10/2001 |
| JP | 2002536817 A | 10/2002 |
| JP | 2003027240 A | 1/2003 |
| WO | 9844543 A1 | 10/1998 |
| WO | 2000034985 | 6/2000 |

OTHER PUBLICATIONS

EPO, PCT Search Report and Written Opinion for PCT/US2004/014610, dated Nov. 30, 2004.

Korean Office Action issued in Application No. 10-2005-7022970 mailed Nov. 25, 2009.

Machine English language translation of JP2003-027240, published Jan. 2003.

Machine English language translation of JP2001-517372, published Oct. 2001.

Japanese Office Action issued in Application No. 2006-532925 mailed Jan. 20, 2010.

Machine English language translation of JP 2002-536817, published Oct. 2002.

Machine English language translation of JP H08-236503, published Sep. 1996.

Machine English language translation of JP 2001-077059, published Mar. 2001.

Partial English language translation of JP 2001-077059, published Mar. 2001.

* cited by examiner

METHOD AND SYSTEM FOR ETCHING A HIGH-K DIELECTRIC MATERIAL

CROSS-REFERENCE TO RELATED APPLICATIONS

This non-provisional application relies for priority on and claims the benefit of the filing date of U.S. Provisional Application No. 60/474,224, filed May 30, 2003, the contents of which are incorporated herein be reference in their entirety.

This non-provisional application also relies for priority on and claims the benefit of the filing date of U.S. Provisional Application No. 60/474,225, filed on May 30, 2003, the contents of which are incorporated herein by reference in their entirety.

FIELD OF THE INVENTION

The present invention relates to a method of etching a substrate, and more particularly to a method etching a high-k dielectric layer on a substrate.

BACKGROUND OF THE INVENTION

In the semiconductor industry, the minimum feature sizes of microelectronic devices are approaching the deep sub-micron regime to meet the demand for faster, lower power microprocessors and digital circuits. Process development and integration issues are key challenges for new gate stack materials and silicide processing, with the imminent replacement of $SiO_2$ and Si-oxynitride ($SiN_xO_y$) with high-permittivity dielectric materials (also referred to herein as "high-k" materials), and the use of alternative gate electrode materials to replace doped poly-Si in sub-0.1 μm complementary metal-oxide semiconductor (CMOS) technology.

Dielectric materials featuring a dielectric constant greater than that of $SiO_2$ (k~3.9) are commonly referred to as high-k materials. In addition, high-k materials may refer to dielectric materials that are deposited onto substrates (e.g., $HfO_2$, $ZrO_2$) rather than grown on the surface of the substrate (e.g., $SiO_2$, $SiN_xO_y$). High-k materials may incorporate metallic silicates or oxides (e.g., $Ta_2O_5$ (k~26), $TiO_2$ (k~80), $ZrO_2$ (k~25), $Al_2O_3$ (k~9), HfSiO, $HfO_2$ (k~25)). During the manufacturing of semiconductor devices, the high-k layers must be etched and removed in order to allow silicidation for the source/drain regions, and to reduce the risk of metallic impurities being implanted into the source/drain regions during ion implantation.

SUMMARY OF THE INVENTION

The present invention relates to a method of etching a substrate, and more particularly to a method etching a high-k dielectric layer on a substrate.

A method for etching a high-k dielectric layer on a substrate atop a substrate holder in a plasma processing system comprising: elevating the substrate temperature above 200° C.; introducing a process gas to the plasma processing system, the process gas comprising a halogen-containing gas; igniting a plasma from the process gas; and exposing the substrate to the plasma for a period of time sufficient to etch the high-k dielectric layer. The process gas can further comprise a reduction gas.

DETAILED DESCRIPTION OF SEVERAL EMBODIMENTS

In material processing methodologies, the wide acceptance of high-k dielectric layers for gate-stacks has required more complex processes to etch such materials. Therein, conventional dry plasma etching of gate-stacks utilizes a set temperature for the substrate holder that, for a process recipe comprising multiple process steps, remains constant for all process steps. In general, since the substrate holder temperature is set by a heat exchanger and the heat exchanger inherently has a large thermal inertia, it has not been practical to alter the heat exchanger temperature between process steps. And consequently, it has not been practical to alter the substrate temperature between process steps.

However, it has become increasingly necessary for advanced gate-stack etching to have a variable substrate temperature between different process steps, within one process recipe. For example, in a gate-stack comprising a doped-poly/TaN/$HfO_2$/Si stack, the doped-poly and TaN layers can be etched at 80° C., which is the setpoint temperature of the substrate holder. Yet, firstly, the selective etching of $HfO_2$ on Si, could require a temperature well above 150° C. And, secondly, it is crucial to introduce a plasma chemistry having a parameter space sufficiently large that the $HfO_2$ gate-dielectric layer can be dry plasma etched without attacking the underlying source/drain Si when it is exposed.

Figure 1:
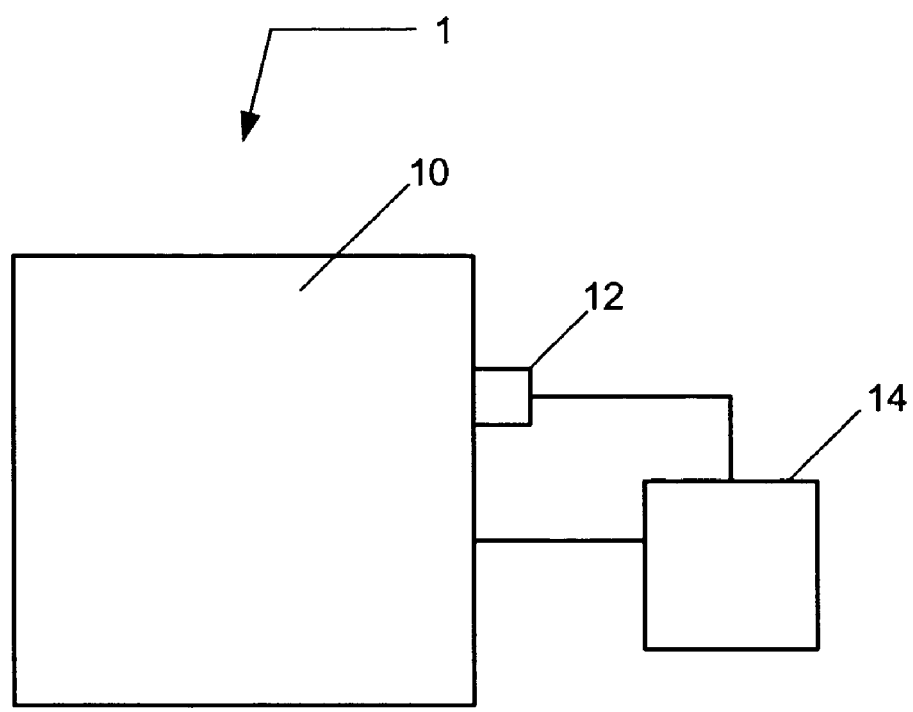
FIG. 1 shows a simplified schematic diagram of a plasma processing system according to an embodiment of the present invention.

According to one embodiment, a plasma processing system 1 is depicted in FIG. 1 comprising a plasma processing chamber 10, a diagnostic system 12 coupled to the plasma processing chamber 10, and a controller 14 coupled to the diagnostic system 12 and the plasma processing chamber 10. The controller 14 is configured to execute a process recipe comprising one or more process steps to etch a gate-stack as described above. Additionally, controller 14 can be configured to receive at least one endpoint signal from the diagnostic system 12 and to post-process the at least one endpoint signal in order to accurately determine an endpoint for the process. In the illustrated embodiment, plasma processing system 1, depicted in FIG. 1, utilizes a plasma for material processing. Plasma processing system 1 can comprise an etch chamber.

Figure 2:
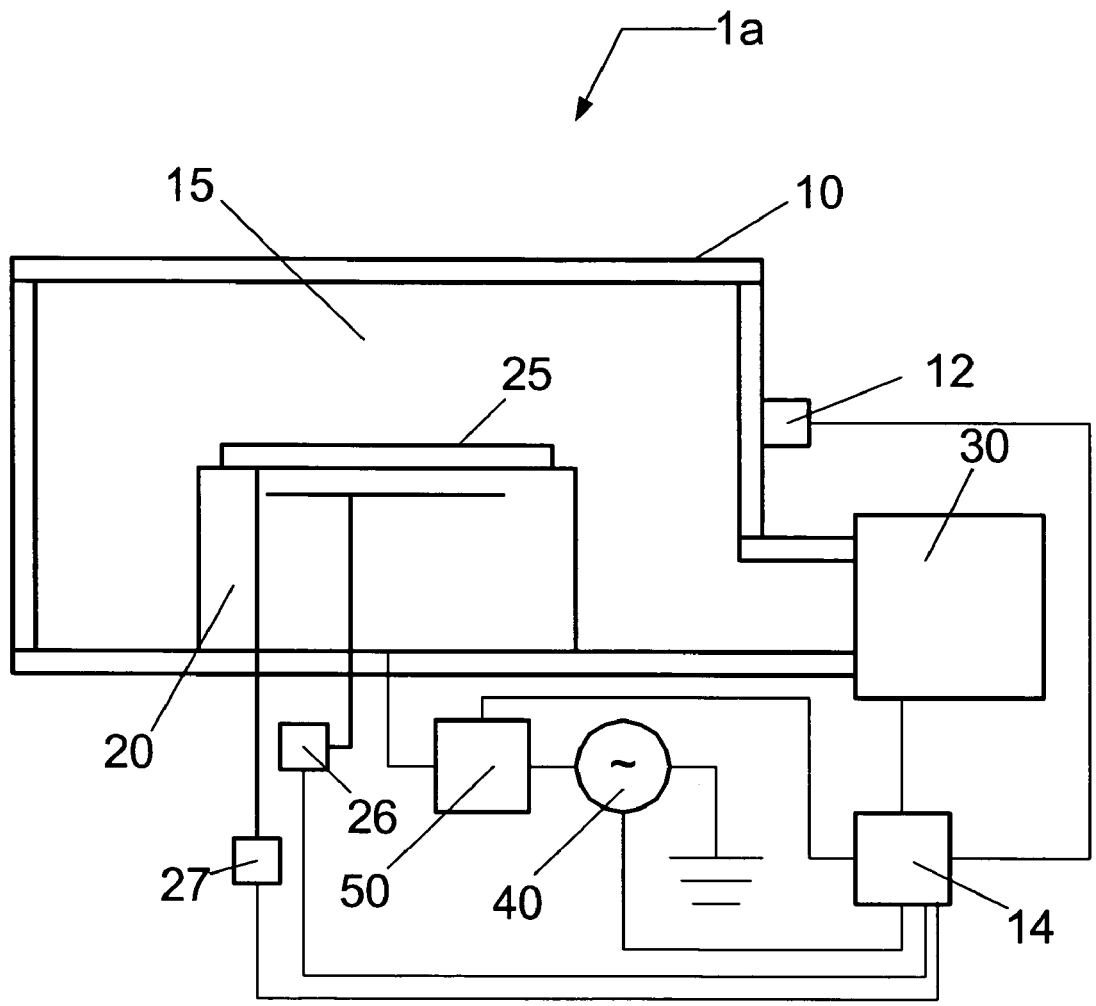
FIG. 2 shows a schematic diagram of a plasma processing system according to another embodiment of the present invention.

According to the embodiment depicted in FIG. 2, plasma processing system 1a can comprise plasma processing chamber 10, substrate holder 20, upon which a substrate 25 to be processed is affixed, and vacuum pumping system 30. Substrate 25 can be, for example, a semiconductor substrate, a wafer or a liquid crystal display. Plasma processing chamber 10 can be, for example, configured to facilitate the generation of plasma in processing region 15 adjacent a surface of substrate 25. An ionizable gas or mixture of gases is introduced via a gas injection system (not shown) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1a can be configured to process 200 mm substrates, 300 mm substrates, or larger.

Substrate 25 can be, for example, affixed to the substrate holder 20 via an electrostatic clamping system 26. Furthermore, substrate holder 20 can, for example, further include a cooling system including a re-circulating coolant flow that receives heat from substrate holder 20 and transfers heat to a heat exchanger system (not shown), or when heating, transfers heat from the heat exchanger system. Moreover, a heat transfer gas can, for example, be delivered to the backside of substrate 25 via a backside gas distribution system 27 to improve the gas-gap thermal conductance between substrate 25 and substrate holder 20. Such a system can be utilized when temperature control of the substrate is desired at elevated or reduced temperatures. For example, the backside gas distribution system 27 can comprise a two-zone or three-zone (or, generically, multizone) gas distribution system, wherein the backside gas (gap) pressure can be independently varied between the center and the edge of substrate 25. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1a.

In the embodiment shown in FIG. 2, substrate holder 20 can comprise an electrode through which RF power is coupled to the processing plasma in process space 15. For example, substrate holder 20 can be electrically biased at a RF voltage via the transmission of RF power from a RF generator 40 through an impedance match network 50 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from 0.1 MHz to 100 MHz. RF systems for plasma processing are well known to those skilled in the art.

Alternately, RF power is applied to the substrate holder electrode at multiple frequencies. Furthermore, impedance match network 50 serves to improve the transfer of RF power to plasma in plasma processing chamber 10 by reducing the reflected power. Match network topologies (e.g., L-type, π-type, T-type, etc.) and automatic control methods are well known to those skilled in the art.

Vacuum pump system 30 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. For example, TMPs are useful for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 14 comprises a microprocessor, memory, and a digital I/O port capable of generating control voltages sufficient to communicate and activate inputs to plasma processing system I a as well as monitor outputs from plasma processing system 1a. Moreover, controller 14 can be coupled to and can exchange information with RF generator 40, impedance match network 50, the gas injection system (not shown), vacuum pump system 30, as well as the backside gas distribution system 27, the substrate/substrate holder temperature measurement system (not shown), and/or the electrostatic clamping system 26. For example, a program stored in the memory can be utilized to activate the inputs to the aforementioned components of plasma processing system 1a according to a process recipe in order to perform the method of etching a gate-stack comprising a high-k dielectric layer. One example of controller 14 is a DELL PRECISION WORKSTATION 610™, available from Dell Corporation, Austin, Tex.

The diagnostic system 12 can include an optical diagnostic subsystem (not shown). The optical diagnostic subsystem can comprise a detector such as a (silicon) photodiode or a photomultiplier tube (PMT) for measuring the light intensity emitted from the plasma. The diagnostic system 12 can further include an optical filter such as a narrow-band interference filter. In an alternate embodiment, the diagnostic system 12 can include at least one of a line CCD (charge coupled device), a CID (charge injection device) array, and a light dispersing device such as a grating or a prism. Additionally, diagnostic system 12 can include a monochromator (e.g., grating/detector system) for measuring light at a given wavelength, or a spectrometer (e.g., with a rotating grating) for measuring the light spectrum such as, for example, the device described in U.S. Pat. No. 5,888,337.

The diagnostic system 12 can include a high resolution Optical Emission Spectroscopy (OES) sensor such as from Peak Sensor Systems, or Verity Instruments, Inc. Such an OES sensor has a broad spectrum that spans the ultraviolet (UV), visible (VIS), and near infrared (NIR) light spectrums. The resolution is approximately 1.4 Angstroms, that is, the sensor is capable of collecting 5550 wavelengths from 240 to 1000 nm. For example, the OES sensor can be equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

Figure 3:
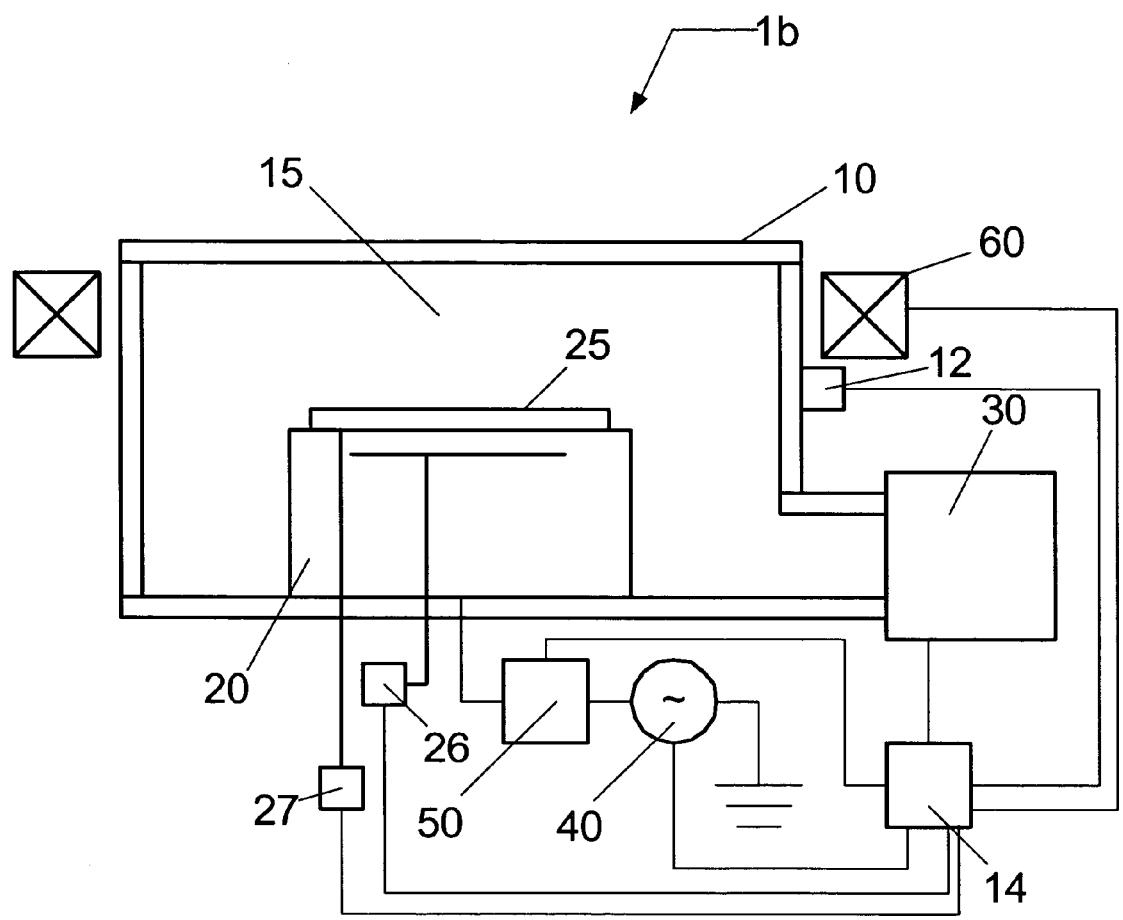
FIG. 3 shows a schematic diagram of a plasma processing system according to another embodiment of the present invention.

In the embodiment shown in FIG. 3, the plasma processing system 1b can, for example, be similar to the embodiment of FIG. 1 or 2 and further comprise either a stationary, or mechanically or electrically rotating magnetic field system 60, in order to potentially increase plasma density and/or improve plasma processing uniformity, in addition to those components described with reference to FIG. 1 and FIG. 2. Moreover, controller 14 can be coupled to magnetic field system 60 in order to regulate the speed of rotation and field strength. The design and implementation of a rotating magnetic field is well known to those skilled in the art.

Figure 4:
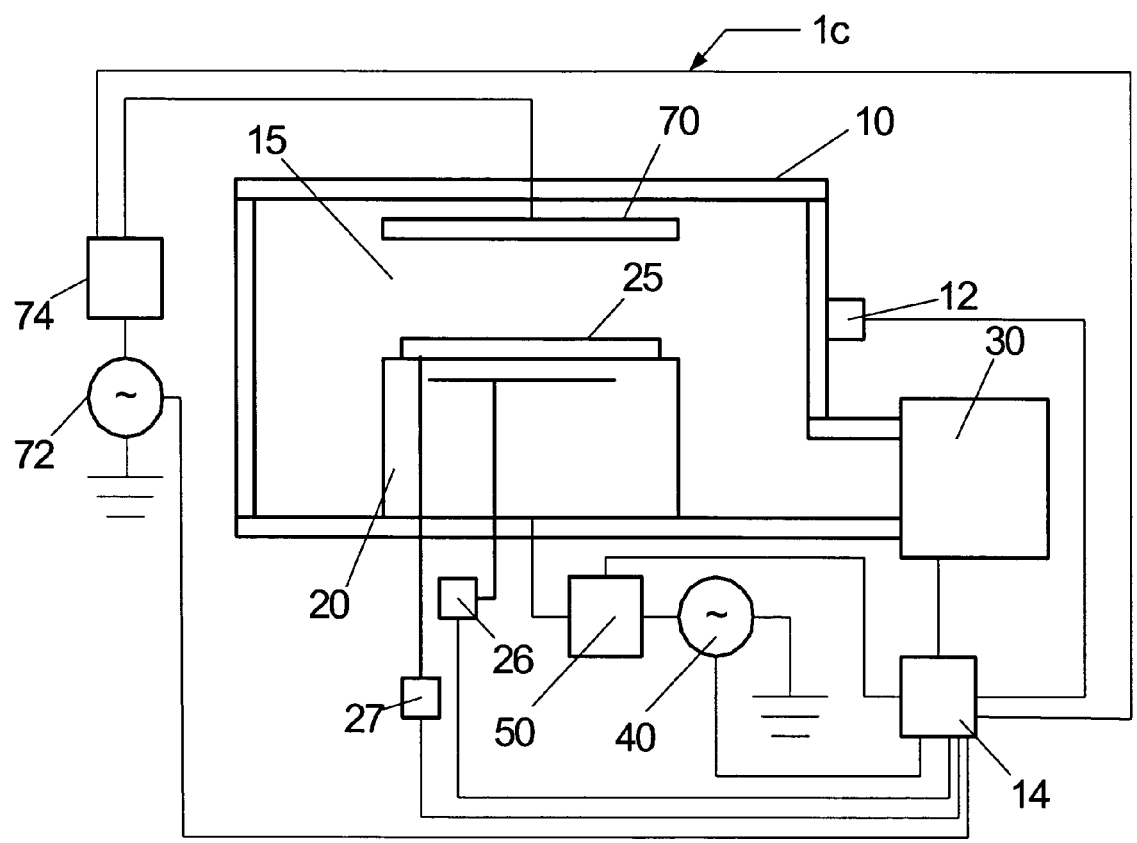
FIG. 4 shows a schematic diagram of a plasma processing system according to another embodiment of the present invention.

In the embodiment shown in FIG. 4, the plasma processing system 1c can, for example, be similar to the embodiments of FIG. 1 and FIG. 2, and can further comprise an upper elec- An exemplary representation of a typical gate-stack can comprise polysilicon/$HfO_2$/$SiO_2$/Si with a TEOS hard mask. The silicon layer (Si) serves as the source/drain, and the $SiO_2$ dielectric layer comprises a thin (~5 Å) interfacial oxide that is sometimes incorporated to improve channel mobility while partially sacrificing the overall gate-dielectric κ value. Table I presents an exemplary process recipe for etching through the polysilicon layer and the $HfO_2$ layer, and stopping on the $SiO_2$ layer.

TABLE I

| step | top-RF | bot-RF | ESC-T | gap | P | Q(sccm) | ESC-volts | ESC-He | $V_{PP}$ | step-time |
|---|---|---|---|---|---|---|---|---|---|---|
| BT | x | y | 80° C. | z | p | q | 1500 V | 3/3 | r | 10 s |
| ME | xx | yy | 80° C. | zz | pp | qq | 1500 V | 3/3 | rr | epd |
| OE | xxx | yyy | 80° C. | zzz | ppp | qqq | 1500 V | 10/10 | rrr | 50 s |
| PPH | 2 kW | 900 W | 80° C. | 80 mm | 200 mt | 2000He | 0 V | 0/0 | 2000/1000 | 30 s |
| DE | 250 W | 20 W | 80° C. | 80 mm | 5 mt | 3 examples: $100HBr$ or $80HBr + 20C_2H_4$ or $50HBr + 50C_2H_4Br_2$ | 0 V | 0/0 | 850/150 | 5 s or epd |
| cool | 0 W | 0 W | 80° C. | 80 mm | 200 mt | 2000He | 1500 V | 10/10 | 0/0 | 30 s | trode 70 to which RF power can be coupled from RF generator 72 through impedance match network 74. A typical frequency for the application of RF power to the upper electrode can range from 0.1 MHz to 200 MHz. Additionally, a typical frequency for the application of power to the lower electrode can range from 0.1 MHz to 100 MHz. Moreover, controller 14 is coupled to RF generator 72 and impedance match network 74 in order to control the application of RF power to upper electrode 70. The design and implementation of an upper electrode is well known to those skilled in the art.

Figure 5:
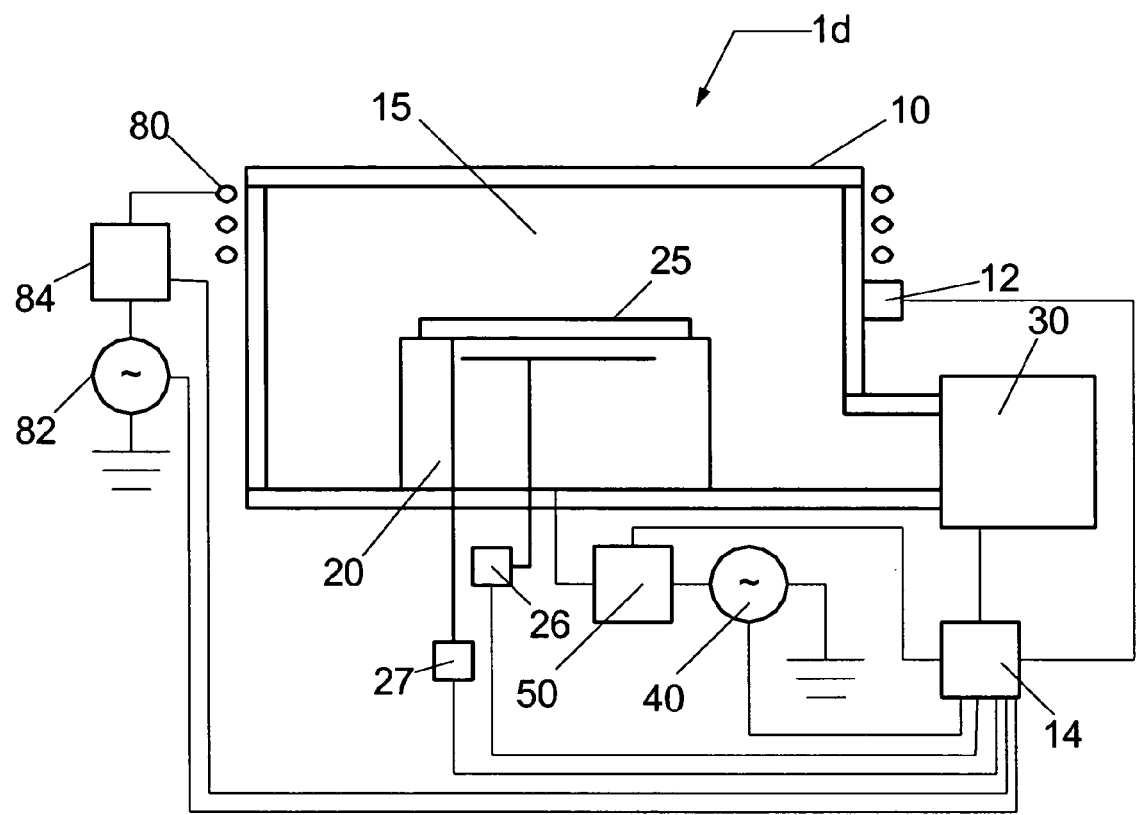
FIG. 5 shows a schematic diagram of a plasma processing system according to another embodiment of the present invention.

In the embodiment shown in FIG. 5, the plasma processing system 1d can, for example, be similar to the embodiments of FIGS. 1 and 2, and can further comprise an inductive coil 80 to which RF power is coupled via RF generator 82 through impedance match network 84. RF power is inductively coupled from inductive coil 80 through dielectric window (not shown) to plasma processing region 15. A typical frequency for the application of RF power to the inductive coil 80 can range from 10 MHz to 100 MHz. Similarly, a typical frequency for the application of power to the chuck electrode can range from 0.1 MHz to 100 MHz. In addition, a slotted Faraday shield (not shown) can be employed to reduce capacitive coupling between the inductive coil 80 and plasma. Moreover, controller 14 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In the following discussion, a method of etching a gate-stack comprising a high-k dielectric layer utilizing a plasma processing device is presented. For example, the plasma processing device can comprise various elements, such as described in FIGS. 1 through 5, and combinations thereof.

For example, in Table I, BT represents a first process step for breaking through the native $SiO_2$ layer; ME represents a second process step comprising the polysilicon main etching step; OE represents an over-etching process step; PPH represents a plasma pre-heat process step; DE represents a dielectric ($HfO_2$) etching process step; and cool represents a substrate cool-down process step.

In the example illustrated in Table I, a plasma processing system as described in FIG. 4 is utilized, wherein top-RF represents upper electrode RF power, where x, xx, xxx represent conventional values for RF power delivered to the top electrode during the native oxide break-through step, the main etch step and the over-etch step, respectively; bot-RF represents lower (substrate holder) electrode RF power, where y, yy, yyy represent conventional values for RF power delivered to the bottom electrode during the native oxide break-through step, the main etch step, and the over-etch step, respectively; ESC-T represents the temperature of the substrate holder; gap represents the separation distance between the upper electrode and the lower electrode, where z, zz, zzz represent conventional values for the spacing between the top (upper) electrode and the bottom (lower) electrode during the native oxide break-through step, the main etch step, and the over-etch step, respectively; P represents the processing chamber pressure, where p, pp, ppp represent conventional values for the processing chamber pressure during the native oxide break-through step, the main etch step, and the over-etch step, respectively; ESC-volts represents the electrode clamping voltage applied to the substrate holder; ESC-He represents the center/edge substrate back-side He pressure (Torr); $V_{PP}$ represents the typical peak-to-peak RF voltage developed on the upper/lower electrode at the set RF power(s), where r, rr, rrr represent conventional values for the peak-to-peak voltage on the bottom (lower) electrode during the native oxide break-through step, the main etch step, and the over-etch step, respectively; and epd represents the end point detection time. Other configurations of the plasma processing system can have somewhat different parameter sets and values.

The flow-rate (Q) listed for the DE step is merely an example reflecting the condition of high flow-rate (i.e., low residence time), where q, qq, qqq represent conventional values for the process gas flow rate(s) during the native oxide break-through step, the main etch step, and the over-etch step, respectively. The listed gases can be used to illustrate the approach of achieving selective $HfO_2$/Si etching. BT, ME and OE process steps and their typical process parameters are understood to those skilled in the art of polysilicon etching, etc. During the cool-down step, RF power is removed to extinguish the processing plasma, and the substrate is cooled through electrostatic clamping (ESC) and backside (helium) heat transfer gas; typically 30 seconds is sufficient to lower the substrate temperature to the temperature of the substrate holder.

Figure 6:
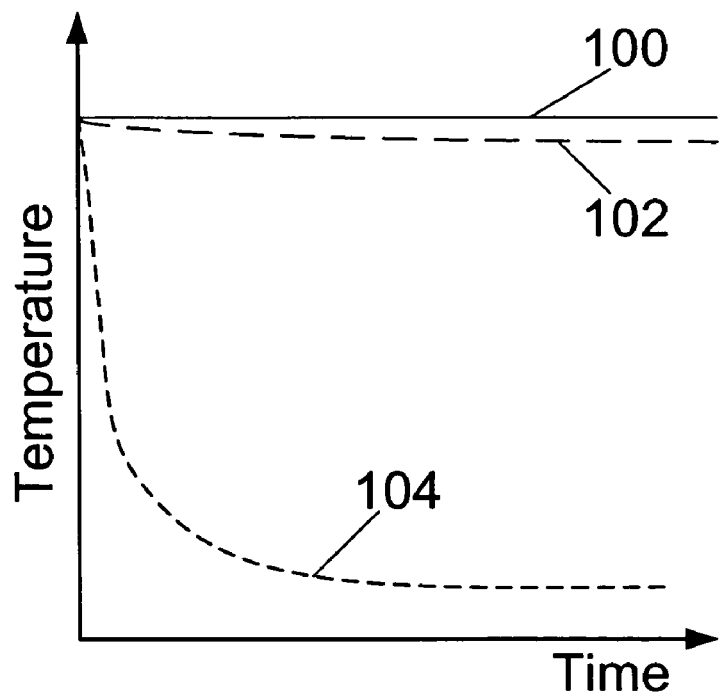
FIG. 6 illustrates a response of substrate temperature to three different conditions.

During plasma pre-heating (PPH), the substrate temperature is elevated from a temperature suitable for etching polysilicon (e.g., 80° C.) to a temperature more suitable for selective etching of $HfO_2$ (e.g., 400° C.). When a substrate simply rests on the substrate holder (i.e., without clamping (via ESC), and backside gas), the substrate is substantially thermally isolated from the substrate holder and the surrounding processing chamber. For example, FIG. 6 presents a typical response for the substrate temperature for three different conditions when resting atop a substrate holder that is maintained at a lower temperature. If the substrate is not clamped to the substrate holder and, therefore, not subjected to a backside gas pressure, then the change in substrate temperature in time is very slow (solid line depicted as 100 in FIG. 6). If, on the other hand, the substrate is clamped to the substrate holder but not subjected to a backside gas pressure, then a slightly increased rate of temperature change is observed in time (long dashed line depicted as 102 in FIG. 6). Moreover, if the substrate is clamped to the substrate holder and subjected to a backside gas pressure, then the substrate temperature decays swiftly initially and then gradually thereafter as the substrate temperature approaches the temperature of the substrate holder (short dashed line depicted as 104 in FIG. 6).

Plasma pre-heating (PPH) of the substrate takes place when the substrate is thermally isolated (i.e., clamping force removed, and back-side gas pressure removed). In general, both ion bombardment and convective hot-neutrals contribute to the heating of the substrate and, to a lesser degree, electron (both thermal and ballistic) heating contributes to the heating process. In highly ionized plasmas (inductively coupled plasma (ICP), wave-heated, etc.), ion bombardment heating can dominate over convective hot-neutrals.

Figure 7:
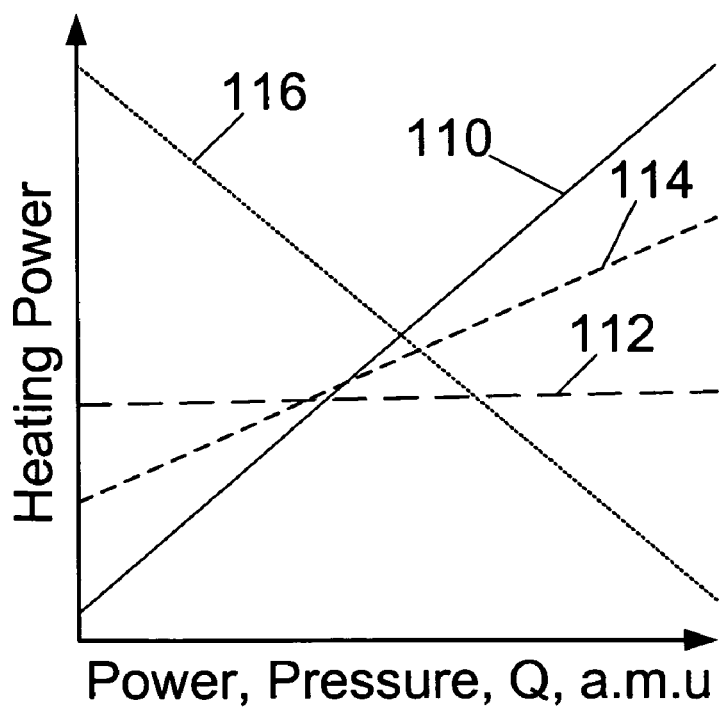
FIG. 7 illustrates the contribution to substrate heating power from four different processing parameters.

In capacitively coupled plasmas (CCP), convective hot-neutrals can be as significant as ion bombardment heating and, in some cases, hot-neutrals can be the dominant heating process. In one embodiment, the plasma pre-heating process comprises introducing an inert gas, such as He, Ar, Kr, and Xe, igniting a plasma from the inert gas, removing the clamping force from the substrate, and removing the back-side gas pressure from the substrate. For example, FIG. 7 illustrates the influence that changes in RF power delivered to the lower electrode, chamber pressure of inert gas, flow rate of inert gas, and atomic mass of inert gas have on the substrate heating power. It has been observed that: (a) the heating power increases with increase in the RF power delivered to the lower electrode (line 110), (b) the heating power increases marginally with increase in the inert gas flow rate (line 114), (c) the heating power increases slightly with increase in inert gas pressure (line 112), and (d) the heating power decreases with an increase in atomic mass of the inert gas (i.e., the use of helium is more effective than argon) (line 116).

Figure 8:
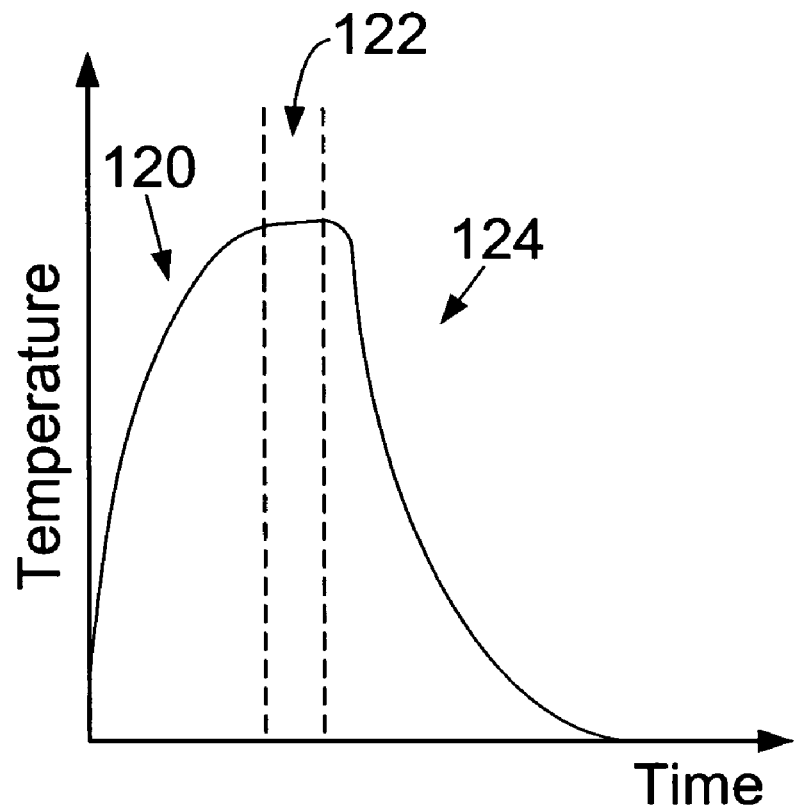
FIG. 8 illustrates response of substrate temperature to heating and cooling during processing.

In an example, FIG. 8 illustrates a description of selective $HfO_2$/Si gate-dielectric etching using the plasma pre-heating (PPH) method. Most devices comprise a range of 20 to 50 Å thick $HfO_2$ gate-dielectric layer. Therefore, the etch time is typically very short (e.g. approximately 5 seconds). The peak substrate temperature under a specific PPH process depends on the PPH time. Once a desired peak substrate temperature is reached (e.g., 400 C) (during period 120), the selective $HfO_2$ etch process recipe is initiated. Typically, the $HfO_2$ etching plasma comprises lower power than PPH; and, therefore, the substrate-heating rate is drastically reduced. Due to ideal thermal isolation, the substrate temperature can remain nearly constant during $HfO_2$ etching (during period 122). Cool down occurs during period 124.

For selective $HfO_2$-to-Si etching, it has been determined that reduction of oxygen (O) from the $HfO_2$ can aid the etch rate. In general, HBr or HCl etches $HfO_2$ faster than a pure halogen ($Br_2$ or $Cl_2$) alone. Therefore, the desired etchants are, for example, HBr, $C_2H_4Br_2$, etc. Both carbon (C) and hydrogen (H) are strong reduction agents. Besides, $(CH_2)_n$ polymer with caged-Br, can form on $HfO_2$, enhancing the reduction process and subsequently enhancing the $HfBr_x$ formation process. All the Hf-halides are nonvolatile, with similar volatility. Therefore, ion bombardment is required to desorb $HfBr_x$ if standard etching temperature is used (e.g., 80° C.). However, high ion bombardment energy in a halogen-containing plasma leads to etching of the underlying silicon (Si) at a greater rate once the source/drain silicon (Si) is exposed. Therefore, the substrate temperature is raised using the PPH process step, since, as substrate temperature increases, $HfBr_x$ desorption increases exponentially. Yet, at high substrate temperature, the Si etch rate also increases exponentially in a pure halogen ambient and, hence, the need for the presence of reduction agents such as H and C.

In the HBr example, HBr can etch $HfO_2$ efficiently; the presence of some gas-phase H would tie up the Br to reduce the Si etching rate. HBr under a low total RF-power condition is not an efficient Si etching condition; its strong ionic bond can tend to bind up free Br. In order to further reduce the Si etching rate, gases such as $C_2H_4$, $C_2H_4Br_2$ can be added to HBr; the additive polymerizes on Si [e.g., $(CH_2)_n$] to further reduce the Si etching rate. Concurrently, such polymer does not impede $HfO_2$ etching rate due to its reduction nature. Alternately, a gas such as $C_2H_6$ can be added to reduce the silicon etch rate. Alternately, diatomic hydrogen ($H_2$) can be added to reduce the silicon etch rate. Alternately, another general method to slow down the Si etching rate is through the growth of SiN or SiO under high substrate temperature. This effect can be achieved through additives containing O and/or N, e.g,. $N_2$ or $O_2$. However, process optimization would require that the presence of O and/or N does not negatively affect the $HfO_2$ etching rate. Additionally, sufficient presence of C and H during $HfO_2$ etching, can accelerate the thermal etch-rate through the aid of reduction.

For example, a $HfO_2$ etch rate of 1649 A/min, and a $HfO_2$-to-Si etch rate selectivity of 2.2 was achieved using the following recipe: PPH Step—upper electrode RF power=700 W; lower electrode RF power=900 W; substrate holder temperature=80° C.; electrode spacing—80 mm; pressure=50 mTorr; gas flow rate=500 sccm He, 2 sccm $Cl_2$; no ESC clamping, no helium backside gas pressure; duration—90 seconds; $HfO_2$ etch—upper electrode RF power=200 W; lower electrode RF power=50 W; substrate holder temperature=80° C.; electrode spacing—80 mm; pressure=5 mTorr; gas flow rate=105 sccm HBr; no ESC clamping, no helium backside gas pressure; duration=10 seconds; and COOL—substrate holder temperature=80° C.; electrode spacing—80 mm; pressure=50 mTorr; gas flow rate=500 sccm He; 1.5 kV ESC clamping, 10 Torr/10 Torr center-edge helium backside gas pressure; duration=30 seconds.

For selective $HfO_2$-to-$SiO_2$ etching, it has been determined that $SiO_2$ etching in HBr plasma remains as ion-driven at high substrate temperature while $HfO_2$ etching becomes one of chemical etching nature. As a result, a low lower electrode RF power condition under high substrate temperature is capable of chemically etching $HfO_2$ at a high rate while etching $SiO_2$ at a slower rate. Firstly, ion bombardment is essential to break the Si—O bond in order to perform any etching. In the case of $C_2H_4$ or $C_2H_4Br_2$ additives, the polymer further protects the Si—O from ion bombardment and could slow the $SiO_2$ etching rate even further.

For example, a $HfO_2$ etch rate of 1649 A/min, and a $HfO_2$-to-$SiO_2$ etch rate selectivity of 25 was achieved using the following recipe: PPH Step—upper electrode RF power=700 W; lower electrode RF power=900 W; substrate holder temperature=80° C.; electrode spacing—80 mm; pressure=50 mTorr; gas flow rate=500 sccm He, 2 sccm $Cl_2$; no ESC clamping, no helium backside gas pressure; duration—90 seconds; $HfO_2$ etch—upper electrode RF power=200 W; lower electrode RF power=50 W; substrate holder temperature=80° C.; electrode spacing—80 mm; pressure=5 mTorr; gas flow rate=105 sccm HBr; no ESC clamping, no helium backside gas pressure; duration=10 seconds; and COOL—substrate holder temperature=80° C.; electrode spacing—80 mm; pressure=50 mTorr; gas flow rate=500 sccm He; 1.5 kV ESC clamping, 10 Torr/10 Torr center-edge helium backside gas pressure; duration=30 seconds.

The trace-$Cl_2$ in PPH is to prevent surface contamination. In many cases, plasma processing systems can comprise quartz components. For example, contamination in pure-He PPH can comprise SiO from the quartz components. Trace-$Cl_2$ in the PPH process step can prevent SiO from forming on the surface of $HfO_2$ layer. Alternately, during a pure-He PPH, a BT process step (break through) can be inserted before the DE step. $CF_4$ BT is known to be effective in removing the $SiO_2$ from the high-k dielectric material surface.

In an embodiment, the method of etching a high-k dielectric layer, such as $HfO_2$, comprises using a halogen containing gas such as at least one of $HBr$, $Cl_2$, $HCl$, $NF_3$, $Br_2$, $C_2H_4Br_2$, and $F_2$. Additionally, the process gas can further comprise a reduction gas such as at least one of $H_2$, $C_2H_4$, $C_2H_4Br_2$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, and $C_6H_{12}$. For example, a process parameter space can comprise a chamber pressure of 1 to 1000 mTorr (e.g., 5 mTorr), a halogen containing gas flow rate ranging from 20 to 1000 sccm (e.g. 50 sccm), a reduction gas flow rate ranging from 1 to 500 sccm (e.g., 50 sccm), an upper electrode RF bias ranging from 100 to 2000 W (e.g., 200 W), and a lower electrode RF bias ranging from 10 to 500 W (e.g., 50 W). Also, the upper electrode bias frequency can range from 0.1 MHz to 200 MHz (e.g., 60 MHz). In addition, the lower electrode bias frequency can range from 0.1 MHz to 100 MHz (e.g., 2 MHz).

Figure 9:
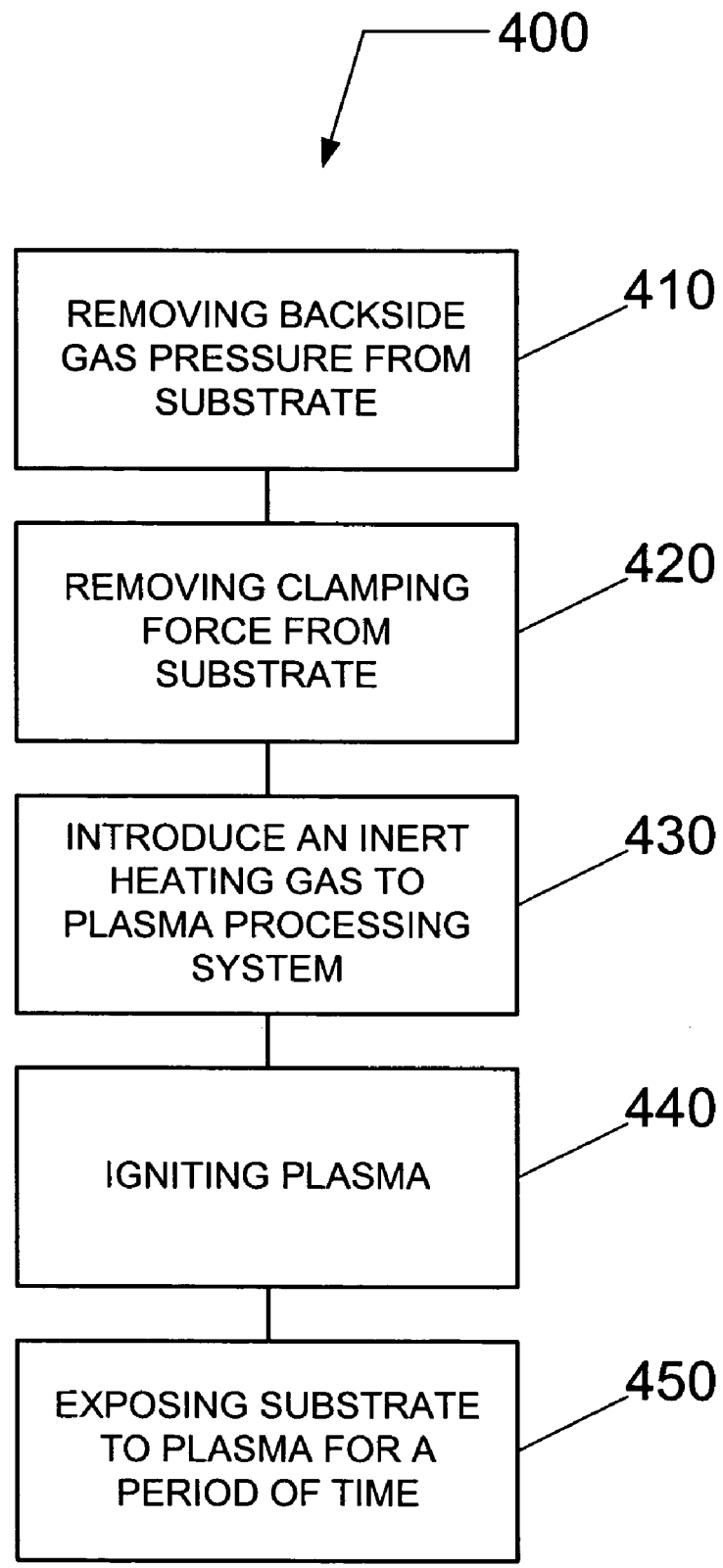
FIG. 9 presents a method of heating a substrate according to an embodiment of the present invention.

FIG. 9 presents a flow chart 400 for heating a substrate in a plasma processing system. Heating the substrate to an elevated temperature can, for example, facilitate a pre-heat process step in a sequence of process steps utilized to etch a series of different layers, such as a plurality of layers forming a gate stack, on the substrate. The gate stack can, for example, comprise silicon-containing layers, high-k dielectric layers, etc. The method begins in 410 with removing the backside gas pressure from the backside of the substrate. For example, in conventional plasma processing systems, the backside gas distribution system comprises a gas supply system having at least one of a control valve, pressure regulator, and a flow controller, and a vacuum pump for evacuating the backside gas distribution channels, etc. When the backside gas pressure is removed, the control valve accessing the gas supply system to the backside gas distribution channels, etc. can, for example, be closed, and the vacuum pump can facilitate evacuation of these channels, etc. The design and use of a backside gas distribution system for improving the thermal conductance between the substrate and the substrate holder is well known to those skilled in the art of the implementation of such systems.

In 420, the clamping force applied to the substrate is removed. For example, the substrate can be either mechanically or electrically clamped to the substrate holder. In the former case, the mechanical clamp is relieved of its application of mechanical pressure to the substrate. In the latter case, the voltage applied to the electrostatic clamp electrode(s) by the high voltage DC source is removed. Once the backside gas pressure and the clamping forces are removed in 410 and 420, the substrate becomes substantially thermally isolated from the substrate holder when resting on the substrate holder in a vacuum environment.

In 430, a heating gas is introduced to the plasma processing system. In one embodiment, the heating gas can comprise an inert gas such as at least one of He, Ar, Kr, and Xe. In an alternate embodiment, the heating gas can further comprise a cleaning gas such as $Cl_2$.

In 440, plasma is ignited, and, in 450, the substantially thermally isolated substrate is exposed to the plasma for a period of time. The plasma can be ignited utilizing any of the techniques discussed above in reference to FIGS. 1 through 5. For example, the plasma can be ignited in a plasma processing system, such as the one described in FIG. 4, via the application of RF power through at least one of the upper electrode and the lower electrode. For example, a process parameter space can comprise a chamber pressure of greater than 20 mTorr (e.g., 50 mTorr), an inert gas flow rate greater than or equal to 200 sccm (e.g.,. 500 sccm), a cleaning gas flow rate less than or equal to 10 sccm (e.g. 2 sccm), an upper electrode RF bias ranging from 100 to 2000 W (e.g., 700 W), and a lower electrode RF bias ranging from 100 to 2000 W (e.g., 900 W). Also, the upper electrode bias frequency can range from 0.1 MHz to 200 MHz (e.g., 60 MHz) * In addition, the lower electrode bias frequency can range from 0.1 MHz to 100 MHz (e.g., 2 MHz). For example, the time period for heating a substrate from room temperature to 400° C. can range from 60 to 120 seconds.

Figure 10:
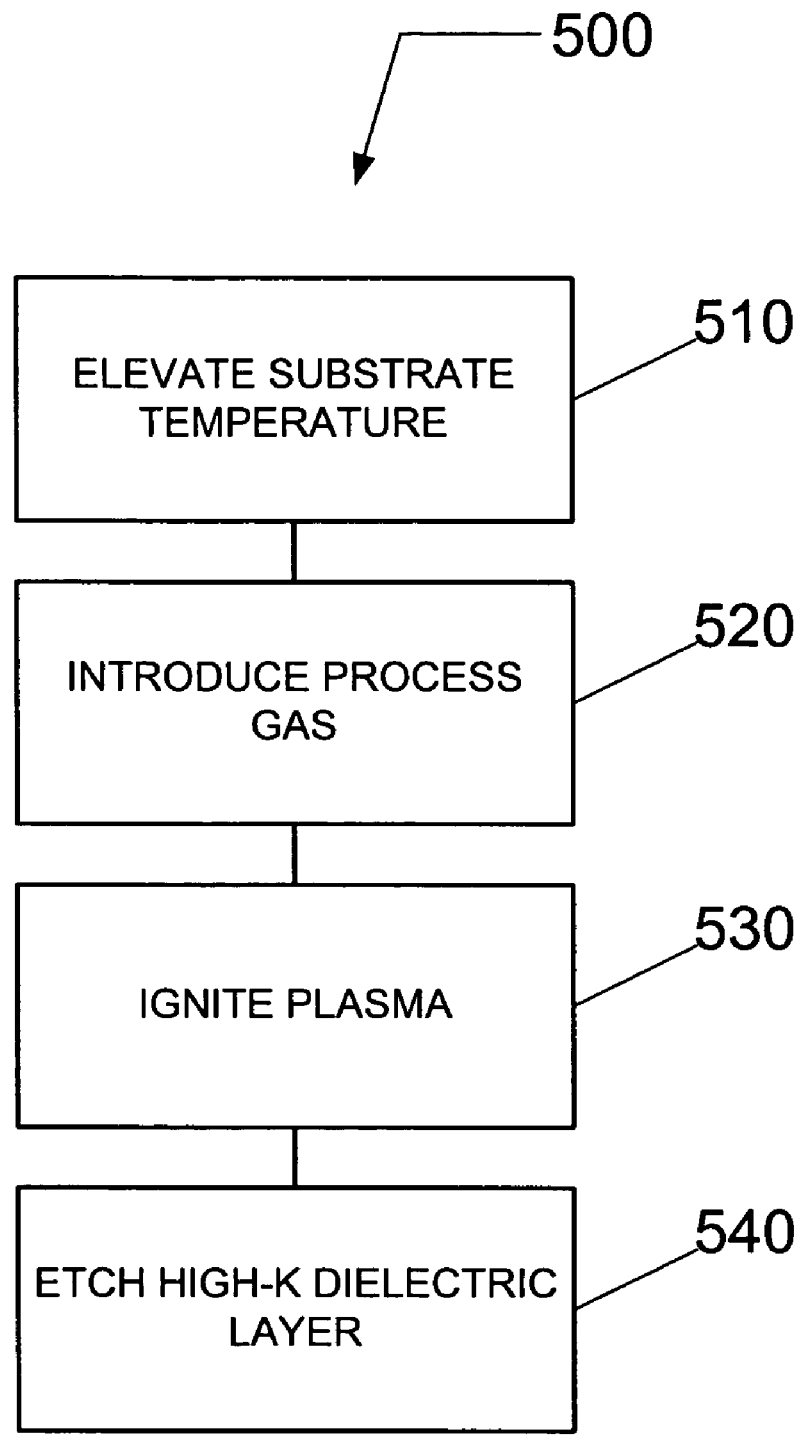
FIG. 10 presents a method of heating a substrate according to another embodiment of the present invention.

FIG. 10 presents a flow chart 500 for a method of etching a high-k dielectric layer on a substrate in a plasma processing system according to an embodiment of the present invention. The method begins in 510 with elevating the substrate temperature. For example, the substrate temperature can be greater than 200° C., and, desirably, the substrate temperature can range from 3000 to 500° C. (e.g., 400° C.). The substrate can, for example, be heated using a pre-heating plasma process (PPH), such as the one described above in reference to FIG. 9.

In 520, a process gas is introduced to the plasma processing system for etching a high-k dielectric layer, such as $HfO_2$. In one embodiment, the process gas comprises a halogen-containing gas such as at least one of HBr, $Cl_2$, HCl, $NF_3$, $Br_2$, $C_2H_4Br_2$, and $F_2$. In an alternate embodiment, the process gas further comprises a reduction gas such as at least one of $H_2$, $C_2H_4$, $C_2H_4Br_2$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, and $C_6H_{12}$. In yet another alternate embodiment, the process gas further comprises at least one of an oxygen-containing gas and a nitrogen-containing gas, such as $O_2$, $N_2$, $N_2O$, and $NO_2$.

In 530, plasma is ignited, and, in 540, the high-k dielectric layer on the substrate is exposed to the plasma for a period of time. The plasma can be ignited utilizing any of the techniques discussed above in reference to FIGS. 1 through 5. For example, the plasma can be ignited in a plasma processing system, such as the one described in FIG. 4, via the application of RF power through at least one of the upper electrode and the lower electrode. For example, a process parameter space can comprise a chamber pressure of 1 to 1000 mTorr (e.g., 5 mTorr), a halogen containing gas flow rate ranging from 20 to 1000 sccm (e.g., 50 sccm), a reduction gas flow rate ranging from 1 to 500 sccm (e.g., 50 sccm), an upper electrode RF bias ranging from 100 to 2000 W (e.g., 200 W), and a lower electrode RF bias ranging from 10 to 500 W (e.g., 50 W). Also, the upper electrode bias frequency can range from 0.1 MHz to 200 MHz (e.g., 60 MHz). In addition, the lower electrode bias frequency can range from 0.1 MHz to 100 MHz (e.g., 2 MHz).

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for etching a high-k dielectric layer on a substrate atop a substrate holder in a plasma processing system comprising:
    disposing a substrate on a substrate holder in a plasma processing system, wherein said substrate comprises a high-k dielectric layer and wherein said substrate further comprises $SiO_2$ or silicon or both;
    electrically biasing said substrate at a radio frequency (RF) voltage via the coupling of RF power to said substrate holder;
    elevating the substrate temperature above 200° C.;
    introducing a process gas to said plasma processing system, said process gas comprising one or more halogen-containing gases selected from the group consisting of HBr and $Br_2$, and one or more reduction gases selected from the group consisting of $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, and $C_6H_{12}$;
    igniting a plasma from said process gas; and
    exposing said substrate to said plasma for a period of time sufficient to etch said high-k dielectric layer,
    wherein said high-k dielectric layer comprises $HfO_2$ and the exposing of said substrate etches said high-k dielectric layer at a rate greater than $SiO_2$ or silicon.

2. The method as recited in claim 1, wherein said process gas further comprises at least one of a nitrogen-containing gas, and an oxygen-containing gas.

3. The method as recited in claim 1, wherein said temperature ranges from 300° to 500° C.

4. A method for etching a high-k dielectric layer on a substrate atop a substrate holder in a plasma processing system comprising:
    disposing a substrate on a substrate holder in a plasma processing system, wherein said substrate comprises a high-k dielectric layer and wherein said substrate further comprises $SiO_2$ or silicon or both;
    electrically biasing said substrate at a radio frequency (RF) voltage via the coupling of RF power to said substrate holder;
    elevating the substrate temperature above 200° C.;
    introducing a process gas to said plasma processing system, said process gas comprising carbon, hydrogen, and bromine;
    igniting a plasma from said process gas; and
    exposing said substrate to said plasma for a period of time sufficient to etch said high-k dielectric layer,
    wherein the process gas comprises HBr and $C_2H_4$, and
    wherein the exposing of said substrate etches said high-k dielectric layer at a rate greater than $SiO_2$ or silicon.

5. The method as recited in claim 4, wherein said process gas further comprises at least one of a nitrogen-containing gas, and an oxygen-containing gas.

6. The method as recited in claim 4, wherein said temperature ranges from 300° to 500° C.

7. A method for etching a high-k dielectric layer on a substrate atop a substrate holder in a plasma processing system comprising:
    disposing a substrate on a substrate holder in a plasma processing system, wherein said substrate comprises a high-k dielectric layer and wherein said substrate further comprises $SiO_2$ or silicon or both;
    electrically biasing said substrate at a radio frequency (RF) voltage via the coupling of RF power to said substrate holder;
    elevating the substrate temperature above 200° C.;
    introducing a process gas to said plasma processing system, said process gas comprising carbon, hydrogen, and bromine;
    igniting a plasma from said process gas; and
    exposing said substrate to said plasma for a period of time sufficient to etch said high-k dielectric layer,
    wherein the process gas comprises HBr, $C_2H_4Br_2$, and one reduction gas selected from the group consisting of $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, and $C_6H_{12}$, and
    wherein the exposing of said substrate etches said high-k dielectric layer at a rate greater than $SiO_2$ or silicon.

8. The method as recited in claim 7, wherein said process gas further comprises at least one of a nitrogen-containing gas, and an oxygen-containing gas.

9. The method as recited in claim 7, wherein said temperature ranges from 300° to 500° C.

10. A method for etching a high-k dielectric layer on a substrate atop a substrate holder in a plasma processing system comprising:
    disposing a substrate on a substrate holder in a plasma processing system, wherein said substrate comprises a high-k dielectric layer and wherein said substrate further comprises $SiO_2$ or silicon or both;
    electrically biasing said substrate at a radio frequency (RF) voltage via the coupling of RF power to said substrate holder;
    elevating the substrate temperature above 200° C.
    introducing a process gas to said plasma processing system, said process gas consisting of one halogen-containing gas selected from the group consisting of HBr and $Br_2$, and one reduction gas selected from the group consisting of $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, and $C_6H_{12}$;
    igniting a plasma from said process gas; and
    exposing said substrate to said plasma for a period of time sufficient to etch said high-k dielectric layer,
    wherein said high-k dielectric layer comprises $HfO_2$ and the exposing of said substrate etches said high-k dielectric layer at a rate greater than $SiO_2$ or silicon.

11. A method for etching a high-k dielectric layer on a substrate atop a substrate holder in a plasma processing system comprising:
    disposing a substrate on a substrate holder in a plasma processing system, wherein said substrate comprises a high-k dielectric layer and wherein said substrate further comprises $SiO_2$ or silicon or both;

electrically biasing said substrate at a radio frequency (RF) voltage via the coupling of RF power to said substrate holder;

elevating the substrate temperature above 200° C.;

introducing a process gas to said plasma processing system, said process gas consisting of carbon, hydrogen, and bromine;

igniting a plasma from said process gas; and exposing said substrate to said plasma for a period of time sufficient to etch said high-k dielectric layer, wherein the process gas consists essentially of HBr and $C_2H_4$, and wherein the exposing of said substrate etches said high-k dielectric layer at a rate greater than $SiO_2$ or silicon.

12. A method for etching a high-k dielectric layer on a substrate atop a substrate holder in a plasma processing system comprising:

disposing a substrate on a substrate holder in a plasma processing system, wherein said substrate comprises a high-k dielectric layer and wherein said substrate further comprises $SiO_2$ or silicon or both;

electrically biasing said substrate at a radio frequency (RF) voltage via the coupling of RF power to said substrate holder;

elevating the substrate temperature above 200° C.;

introducing a process gas to said plasma processing system, said process gas consisting of carbon, hydrogen, and bromine;

igniting a plasma from said process gas;

exposing said substrate to said plasma for a period of time sufficient to etch said high-k dielectric layer, wherein the process gas consists essentially of HBr, $C_2H_4Br_2$, and one reduction gas selected from the group consisting of $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, and $C_6H_{12}$, and wherein the exposing of said substrate etches said high-k dielectric layer at a rate greater than $SiO_2$ or silicon.

\* \* \* \* \*